(12) United States Patent
Camacho et al.

(10) Patent No.: US 7,911,067 B2
(45) Date of Patent: Mar. 22, 2011

(54) SEMICONDUCTOR PACKAGE SYSTEM WITH DIE SUPPORT PAD

(75) Inventors: Zigmund Ramirez Camacho, Singapore (SG); Dioscoro A. Merilo, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 114 days.

(21) Appl. No.: 12/235,144

(22) Filed: Sep. 22, 2008

(65) Prior Publication Data

US 2010/0072589 A1 Mar. 25, 2010

(51) Int. Cl.
*H01L 23/12* (2006.01)
(52) U.S. Cl. .............. 257/783; 257/784; 257/E23.04
(58) Field of Classification Search ............ 257/671
See application file for complete search history.

(56) References Cited

U.S. PATENT DOCUMENTS

| | | | |
|---|---|---|---|
| 5,929,514 A | 7/1999 | Yalamanchili | |
| 6,198,163 B1 | 3/2001 | Crowley et al. | |
| 6,894,376 B1 | 5/2005 | Mostafazadeh et al. | |
| 6,927,479 B2 | 8/2005 | Ramakrishna | |
| 6,943,061 B1 | 9/2005 | Sirinorakul et al. | |
| 7,126,218 B1 | 10/2006 | Darveaux et al. | |
| 7,161,232 B1 | 1/2007 | Lee et al. | |
| 7,214,562 B2 | 5/2007 | Lum et al. | |
| 7,288,439 B1 | 10/2007 | Mostafazadeh et al. | |
| 7,298,026 B2 | 11/2007 | Shim et al. | |
| 7,338,841 B2 | 3/2008 | Lau | |
| 7,339,257 B2 | 3/2008 | Ozawa et al. | |
| 7,365,417 B2 | 4/2008 | Camacho et al. | |
| 7,419,855 B1 | 9/2008 | Lee et al. | |
| 2006/0210805 A1* | 9/2006 | Mizuno ................ | 428/413 |
| 2007/0158792 A1* | 7/2007 | Camacho et al. ........ | 257/666 |

* cited by examiner

*Primary Examiner* — Stephen W Smoot
(74) *Attorney, Agent, or Firm* — Mikio Ishimaru (57) ABSTRACT

A semiconductor package system includes: providing a lead frame with a lead; making a die support pad separately from the lead frame; attaching a semiconductor die to the die support pad through a die attach adhesive, the semiconductor die being spaced from the lead; and connecting a bonding pad on the semiconductor die to the lead using a bonding wire.

10 Claims, 7 Drawing Sheets

SEMICONDUCTOR PACKAGE SYSTEM WITH DIE SUPPORT PAD

TECHNICAL FIELD

The present invention relates generally to semiconductor packages, and more particularly to a system for a semiconductor package accommodating enhanced die size and lead count.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Packages including integrated circuit chips typically have numerous external pins that are mechanically attached by solder or by a variety of other known techniques to conductor patterns on the printed wiring board.

Typically, the packages on which these integrated semiconductor chips, or semiconductor dies, are mounted include a substrate or other chip-mounting device. One example of such a substrate is a leadframe. Leadframes also typically include at least an area on which an integrated circuit chip is mounted and multiple power, ground, and/or signal leads to which power, ground, and/or signal sites of the integrated semiconductor die are electronically attached. The area on which the integrated circuit is mounted is typically called a die pad. The multiple leads typically form the outer frame of the leadframe. The die pad is typically connected to the outer frame leads by tiebars so that the whole leadframe is a single integral piece of metal.

Leadframes have been used extensively in the integrated circuit packaging industry mainly because of their low manufacturing cost and high reliability. Recent development such dual or multi-row leadframes have been proposed to increase packaging density and further reduce cost.

Typical leadframe packages include a die pad, surrounded by a number of leads. The leads are temporarily attached to the die pad by the tiebars. An integrated circuit chip is attached to the die pad using a conductive adhesive such as silver epoxy. Such an adhesive is typically called a die attach adhesive. The die attach adhesive is cured after the die attach. After the die is attached to the die pad, a wire-bonding process is used to make electrical interconnections between the integrated circuit and the leads of the leadframe. After wire bonding, the leadframe with the integrated circuit attached is encapsulated using a mold compound. Such enclosures may include encapsulant in a plastic, epoxy or a multi-part housing made of plastic ceramic, or metal with the purpose of protecting the leadframe and the attached chip from physical, electrical, and/or chemical damage. Finally, post mold curing and singulation steps are conducted to complete the packaging process.

In typical leadframe packages, the semiconductor die mounted is smaller than or of the same size of the die pad. In such a configuration, the surrounding leads occupy space where there is no functional semiconductor device. Therefore the density of semiconductor devices on the leadframe is limited. The current trend of the semiconductor industry is to increase the device density on the leadframe. Therefore such wasted space in the typical leadframe design presents a problem.

Certain methods are proposed to solve this problem. One is the overhang die approach. In this approach, the semiconductor die is positioned in such a way that the edge portion of the semiconductor die overhangs the leads of the leadframe. In so doing, the leadframe could be made smaller and the previously wasted space is utilized because that space is now occupied by the edge portion of the semiconductor die. However, the overhang approach has various problems. First, it has difficulty in die attach adhesive dispense for the overhung semiconductor die and the adhesive boundary is difficult to define. Second, because of the existence of the tiebar connecting the die pad and the leads, it is difficult to increase the lead count, especially for dual or multi-row leadframes.

Another approach is the chip on lead approach. In this approach, the die pad is eliminated from the leadframe and only the leads are left. Instead of being attached to the die pad, the edge portion of the semiconductor die is placed on top of the leads directly. In so doing, the leadframe could be made smaller and the previously wasted space is utilized because that space is now occupied by the edge portion of the semiconductor die. However, the chip on lead approach also has various problems. First, because the die pad is eliminated, there is a large contact area between the die attach adhesive and the mold compound underneath the semiconductor die. This area is known to have high risk of delamination. Second, the semiconductor die is directly in contact with the leads of the leadframe. Typically the tips of the leads are coated with silver. Silver tends to migrate through the die attach adhesive layer and reach the semiconductor die, resulting in leakage problems that manifest as field failure over time.

Thus, a need still remains for reducing the difficulty in die attach adhesive dispense, maximizing the lead counts of the leadframe, alleviating the delamination problem, and solving the silver migration problem for the overhang die and the chip on lead approaches. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a semiconductor package system including: providing a leadframe with a lead; making a die support pad separately from the leadframe; attaching a semiconductor die to the die support pad through a die attach adhesive, the semiconductor die being spaced from the lead; and connecting a bonding pad on the semiconductor die to the lead using a bonding wire.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. Likewise, the drawings showing embodiments of the system are semi-diagrammatic and not to scale and, particularly, some of the dimensions are for the clarity of presentation and are shown exaggerated in the drawings. Also, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the leadframe, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "system" as used herein refers to and is defined as the method and as the apparatus of the present invention in accordance with the context in which the term is used.

The term "coplanar" is defined as being in the same plane or flat. With regard to an unfinished leadframe the term means that the unfinished leadframe is in one plane and flat as contrasted with having different heights.

Figure 1:
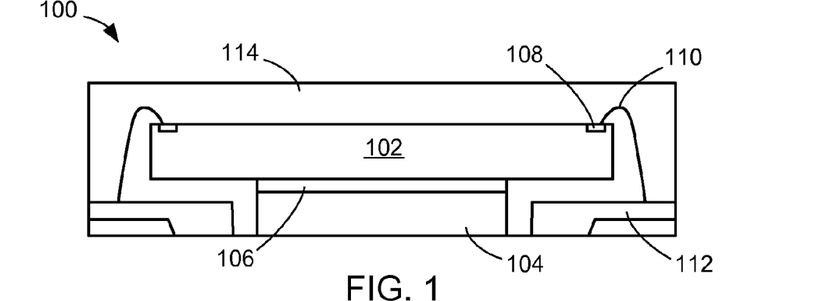
FIG. 1 is a cross-sectional view of a semiconductor package system after a stage of singulation.

Referring now to FIG. 1, therein is shown a cross-sectional view of a semiconductor package system 100 after a stage of singulation. A finished semiconductor package system 100 is shown. A semiconductor die 102 is present. The semiconductor die 102 is attached to a die support pad 104 through a die attach adhesive 106. A bonding pad 108 is on the semiconductor die 102. A bonding wire 110 connects the bonding pad 108 to a lead 112 of leadframe. The semiconductor die 102, the die support pad 104, the die attach adhesive 106, the bonding pad 108, the bonding wire 110, and the lead 112 are encapsulated in a mold compound 114.

In this embodiment of the present invention, the semiconductor die 102 overhangs the lead 112. The die support pad 104 may be made out of copper or other metals. The die support pad 104 is made separately from the leadframe. The material of the die support pad 104 may or may not be the same material as the lead 112.

It is discovered that the die support pad 104 may enhance thermal performance of the semiconductor package. It may also increase lead count because the absence of tiebar makes available space for additional lead. Also, since the die attach adhesive 106 is not on the lead 112, it is discovered that there is no possibility of silver migration through the die attach adhesive 106 to the semiconductor die 102 over time which causes current leakage, shorting problems and leads to field failure of the package. Furthermore, due to the minimized contact area between the die attach adhesive 106 and the mold compound 114, it is found that the delamination problem is alleviated.

The die support pad 104 can be made out of diced or punched copper from sheet copper that is pre-coated or laminated with the die attach adhesive 106. The bottom surface of the die support pad 104 can be pre-plated with NiPd. The pre-coating of the die attach adhesive 106 reduces the difficulty of adhesive dispense problem encountered before.

Figure 2:
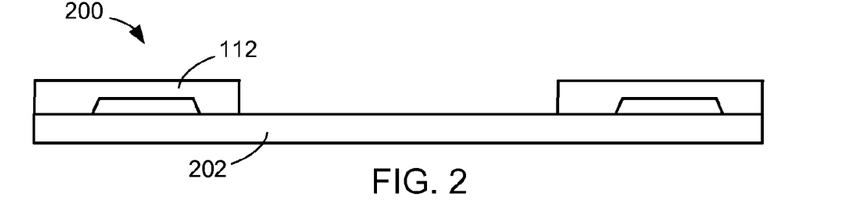
FIG. 2 is a cross-sectional view of an unfinished semiconductor package of a first embodiment of the present invention along line 3-3 of FIG. 3 after a first intermediate stage of the process.
Figure 3:
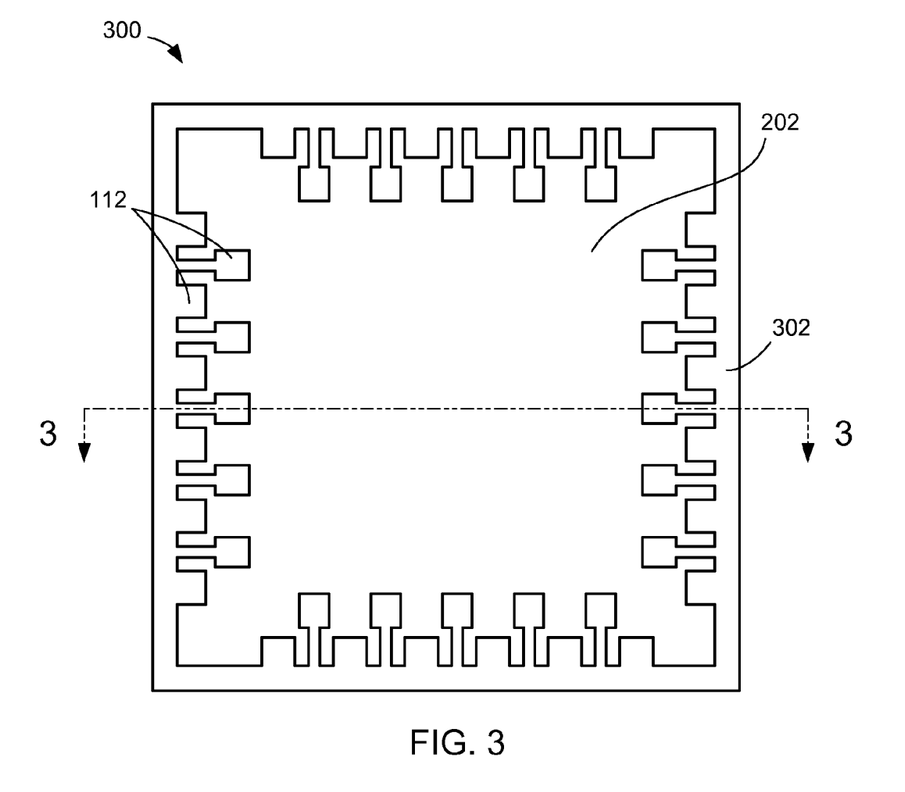
FIG. 3 is a top view of an unfinished semiconductor package of the first embodiment of the present invention after the first intermediate stage of the process.

Referring now to FIG. 2, therein is shown a cross-sectional view of an unfinished semiconductor package 200 of a first embodiment of the present invention along line 3-3 of FIG. 3 after a first intermediate stage of the process. A leadframe with the lead 112 is attached to a coverlay tape 202.

Referring now to FIG. 3, therein is shown a top view of an unfinished semiconductor package 300 of the first embodiment of the present invention after the first intermediate stage of the process. A leadframe 302 is shown. The leads 112 are formed on the peripheral edge of the leadframe 302. The coverlay tape 202 is also shown. The central region of the leadframe 302 is open due to the absence of a traditional die attach pad and tie bars (not shown) required to support it.

Figure 4:
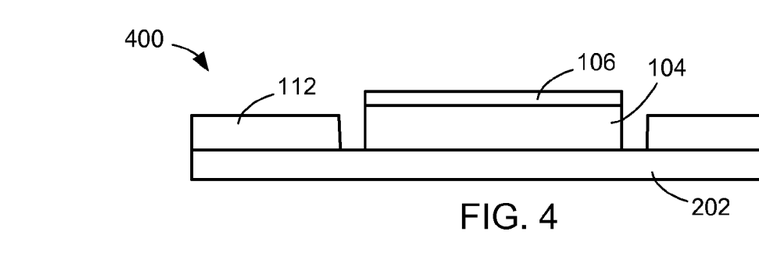
FIG. 4 is a cross-sectional view of an unfinished semiconductor package of the first embodiment of the present invention along line 5-5 of FIG. 5 after a second intermediate stage of the process.
Figure 5:
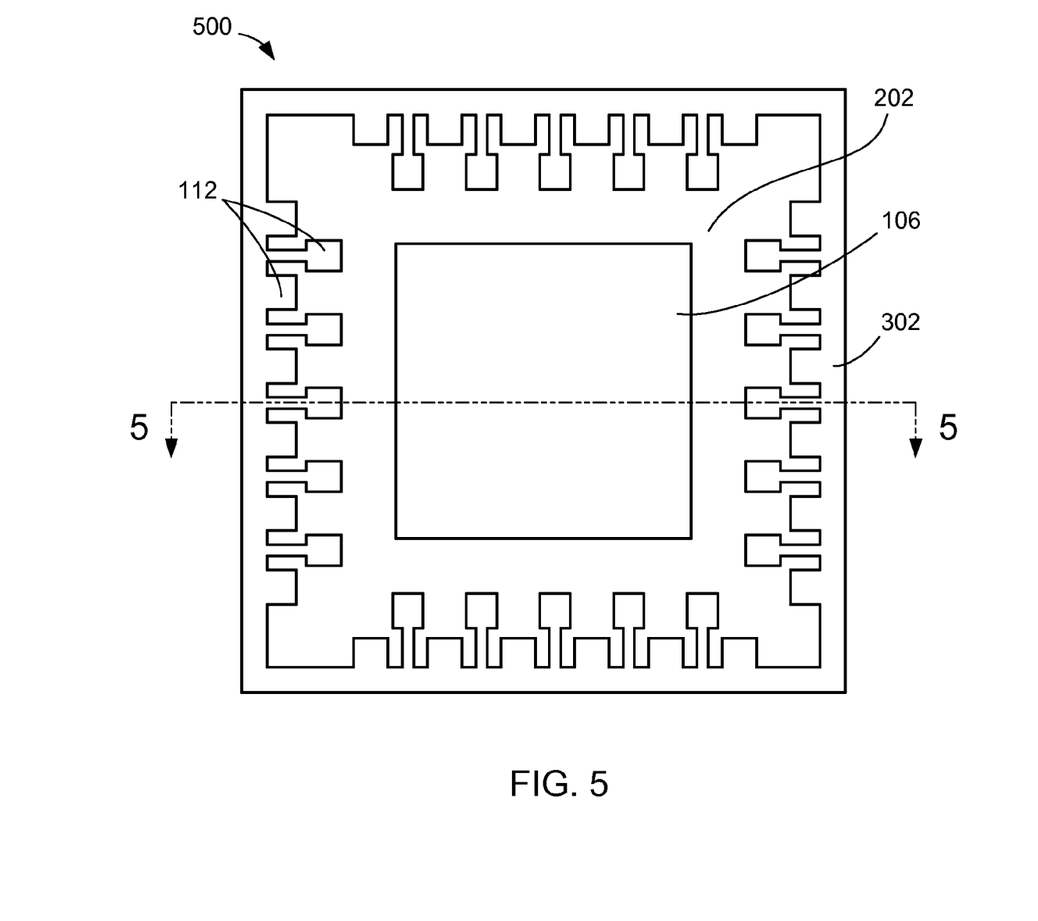
FIG. 5 is a top view of an unfinished semiconductor package of the first embodiment of the present invention after the second intermediate stage of the process.

Referring now to FIG. 4, therein is shown a cross-sectional view of an unfinished semiconductor package 400 of the first embodiment of the present invention along line 5-5 of FIG. 5 after a second intermediate stage of the process. The die support pad 104 with the die attach adhesive 106 is positioned on the coverlay tape 202. The die attach adhesive 106 may be pre-coated on the die support pad 104. The unit of the die support pad 104 and the die attach adhesive 106 may be positioned on the coverlay tape 202 by a method called pick and place. The pre-coating of the die attach adhesive 106 is found to reduce the difficulty of adhesive dispense problem encountered before.

Referring now to FIG. 5, therein is shown a top view of an unfinished semiconductor package 500 of the first embodiment of the present invention after the second intermediate stage of the process. The leadframe 302 is shown. The lead 112 is on the leadframe 302. The coverlay tape 202 and die attach adhesive 106 are also shown.

Figure 6:
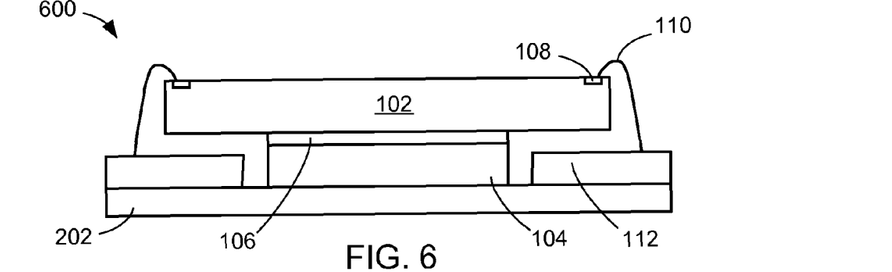
FIG. 6 is a cross-sectional view of an unfinished semiconductor package of the first embodiment of the present invention along line 7-7 of FIG. 7 after a third intermediate stage of the process.
Figure 7:
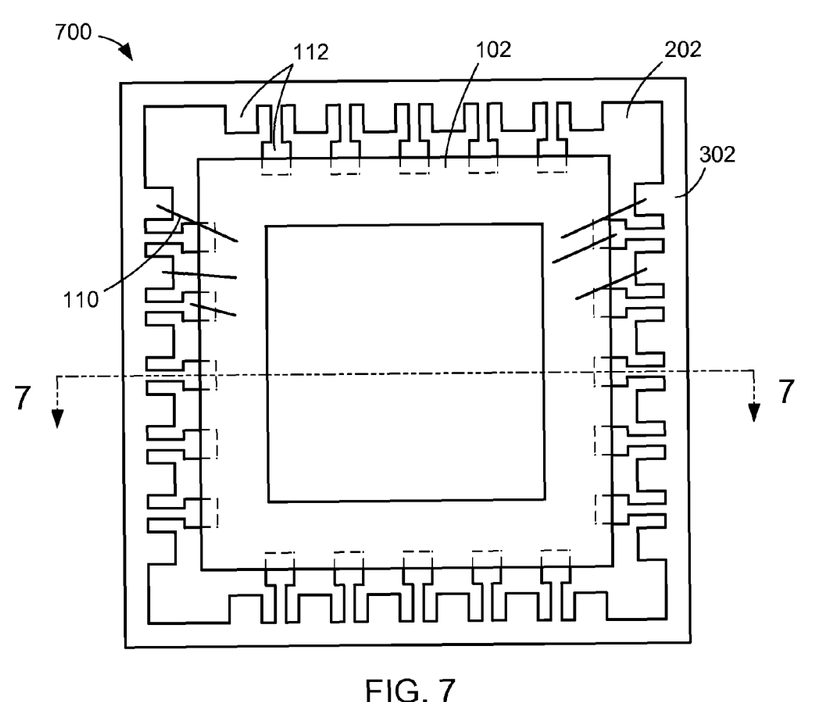
FIG. 7 is a top view of an unfinished semiconductor package of the first embodiment of the present invention after the third intermediate stage of the process.

Referring now to FIG. 6, therein is shown a cross-sectional view of an unfinished semiconductor package 600 of the first embodiment of the present invention along line 7-7 of FIG. 7 after a third intermediate stage of the process. The semiconductor die 102 is attached to the die attach adhesive 106. The bonding wire 110 connects the bonding pad 108 on the semiconductor die 102 to the lead 112.

Referring now to FIG. 7, therein is shown a top view of an unfinished semiconductor package 700 of the first embodiment of the present invention after the third intermediate stage of the process. The leadframe 302 is shown. The lead 112 is on the leadframe 302. The coverlay tape 202 is also shown. The semiconductor die 102 overhangs the lead 112. The bonding wire 110 connects the semiconductor die 102 to the lead 112.

Figure 8:
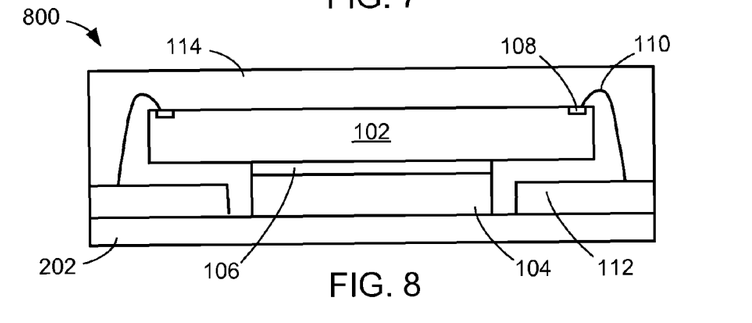
FIG. 8 is a cross-sectional view similar to FIG. 6 of an unfinished semiconductor package of the first embodiment of the present invention after a fourth intermediate stage of the process.

Referring now to FIG. 8, therein is shown a cross-sectional view similar to FIG. 6 of an unfinished semiconductor package 800 of the first embodiment of the present invention after a fourth intermediate stage of the process. The semiconductor die 102, the bonding pad 108, the bonding wire 110, the die attach adhesive 106, the die support pad 104, and the lead 112 are encapsulated in the mold compound 114. The mold compound 114 is also in touch with the coverlay tape 202.

Figure 9:
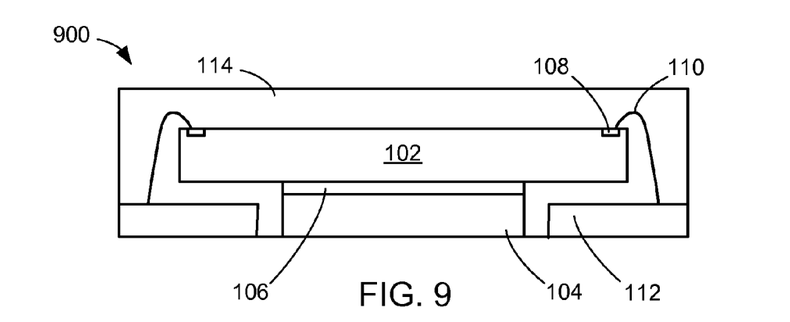
FIG. 9 is a cross-sectional view similar to FIG. 6 of an unfinished semiconductor package of the first embodiment of the present invention after a fifth intermediate stage of the process.

Referring now to FIG. 9, therein is shown a cross-sectional view similar to FIG. 6 of an unfinished semiconductor package 900 of the first embodiment of the present invention after a fifth intermediate stage of the process. The coverlay tape 202 is removed. The removal method may be a peeling process.

Figure 10:
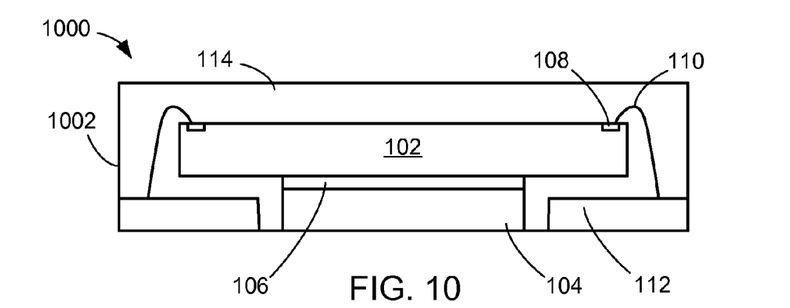
FIG. 10 is a cross-sectional view similar to FIG. 6 of an unfinished semiconductor package of the first embodiment of the present invention after a sixth intermediate stage of the process.

Referring now to FIG. 10, therein is shown a cross-sectional view similar to FIG. 6 of an unfinished semiconductor package 1000 of the first embodiment of the present invention after a sixth intermediate stage of the process. The leadframe is singulated and a package edge 1002 is formed.

Figure 11:
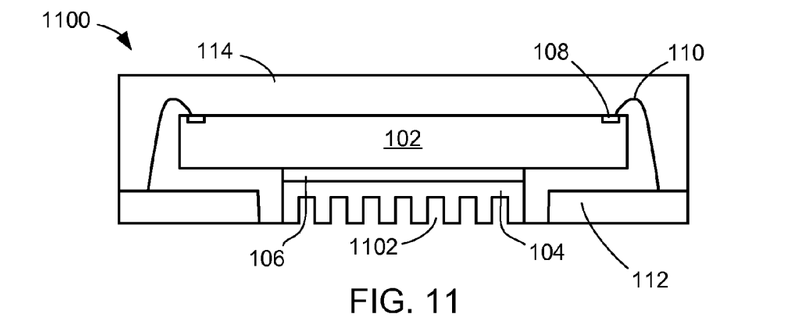
FIG. 11 is a cross-sectional view similar to FIG. 1 of a semiconductor package system of a second embodiment of the present invention after a stage of singulation.

Referring now to FIG. 11, therein is shown a cross-sectional view similar to FIG. 1 of a semiconductor package system 1100 of a second embodiment of the present invention after a stage of singulation. A finished semiconductor package system 1100 is shown. The semiconductor die 102 is present. The semiconductor die 102 is attached to the die support pad 104 through the die attach adhesive 106. The bonding pad 108 is on the semiconductor die 102. The bonding wire 110 connects the bonding pad 108 to the lead 112 of leadframe. The semiconductor die 102, the die support pad 104, the die attach adhesive 106, the bonding pad 108, the bonding wire 110, and the lead 112 are encapsulated in the mold compound 114. A die support pad groove 1102 is formed in the die support pad 104.

In this embodiment of the present invention, the semiconductor die 102 overhangs the lead 112. The die support pad 104 may be made out of copper or other metal. The die support pad 104 is made separately from the leadframe. The material of the die support pad 104 may or may not be the same material as the lead 112.

It has been discovered that the die support pad 104 may enhance thermal performance of the semiconductor package. It may also increase lead count because the absence of tiebar makes available space for additional lead. Also, since the die attach adhesive 106 is not on the lead 112, it is discovered that there is no possibility of silver migration through the die attach adhesive 106 to the semiconductor die 102 over time which causes current leakage, shorting problems and leads to field failure of the package. Furthermore, due to the minimized contact between the die attach adhesive 106 and the mold compound 114, it has been found that the delamination problem is alleviated.

The presence of the die support pad groove 1102 increases the area of the die support pad 104 that is exposed to the outside world. The die support pad 104 with the die support pad groove 1102 may be called a finned heat sink plate. It has been discovered that the presence of the die support pad groove 1102 will improve the thermal performance of the package.

The die support pad 104 can be made out of diced or punched copper from sheet copper that is pre-coated or laminated with the die attach adhesive 106. The bottom surface of the die support pad 104 and the surface of the die support pad groove 1102 can be pre-plated with NiPd. The pre-coating of the die attach adhesive 106 reduces the difficulty of adhesive dispense problem encountered before.

Figure 12:
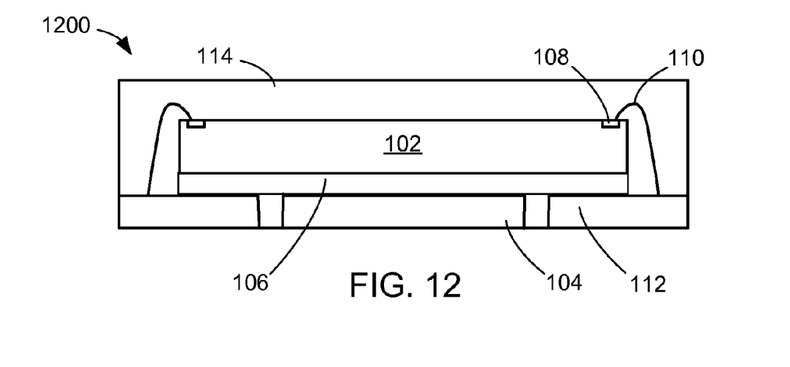
FIG. 12 is a cross-sectional view similar to FIG. 1 of a semiconductor package system of a third embodiment of the present invention after a stage of singulation.

Referring now to FIG. 12, therein is shown a cross-sectional view similar to FIG. 1 of a semiconductor package system 1200 of a third embodiment of the present invention after a stage of singulation. A finished semiconductor package system 1200 is shown. The semiconductor die 102 is present. The semiconductor die 102 is attached to the die attach adhesive 106. The die support pad 104 is attached to the die attach adhesive 106. The bonding pad 108 is on the semiconductor die 102. The bonding wire 110 connects the bonding pad 108 to the lead 112 of leadframe. The die attach adhesive 106 is in contact with the lead 112. The semiconductor die 102, the die support pad 104, the die attach adhesive 106, the bonding pad 108, the bonding wire 110, and the lead 112 are encapsulated in the mold compound 114.

In this embodiment of the present invention, the semiconductor die 102 overhangs the lead 112 and the die attach adhesive 106 is in contact with the lead 112. The die support pad 104 may be made out of copper or other metal. The die support pad 104 is made separately from the leadframe. The material of the die support pad 104 may or may not be the same material as the lead 112.

It has been discovered that the die support pad 104 may enhance thermal performance of the semiconductor package. It may also increase lead count because the absence of tiebar makes available space for additional lead. Furthermore, due to the minimized contact between the die attach adhesive 106 and the mold compound 114, it has been found that the delamination problem is alleviated.

The die support pad 104 can be made out of diced or punched copper from sheet copper that is pre-plated with NiPd. The bottom surface of the die support pad 104 can be pre-plated with NiPd. This is found to alleviate any problem with plating them after the package assembly.

Figure 13:
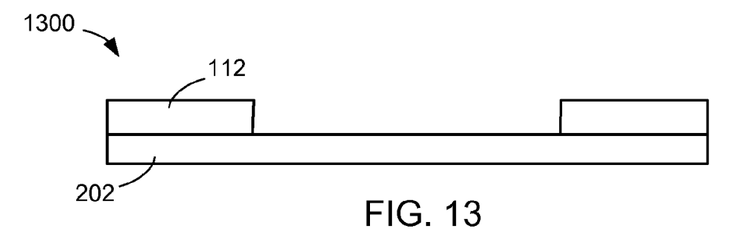
FIG. 13 is a cross-sectional view similar to FIG. 2 of an unfinished semiconductor package of the third embodiment of the present invention after a first intermediate stage of the process.

Referring now to FIG. 13, therein is shown a cross-sectional view similar to FIG. 2 of an unfinished semiconductor package 1300 of the third embodiment of the present invention after a first intermediate stage of the process. The leadframe with lead 112 is attached to the coverlay tape 202.

Figure 14:
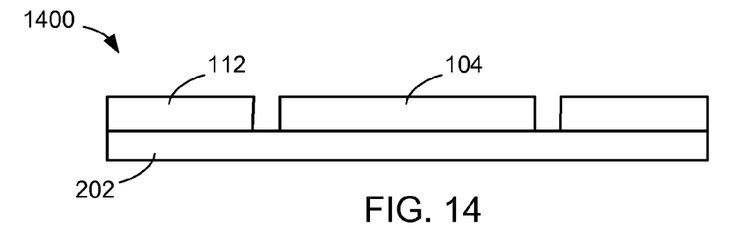
FIG. 14 is a cross-sectional view similar to FIG. 13 of an unfinished semiconductor package of the third embodiment of the present invention after a second intermediate stage of the process.

Referring now to FIG. 14, therein is shown a cross-sectional view similar to FIG. 13 of an unfinished semiconductor package 1400 of the third embodiment of the present invention after a second intermediate stage of the process. The die support pad 104 is positioned on the coverlay tape 202. The die support pad 104 may be positioned on the coverlay tape 202 by a method called pick and place.

Figure 15:
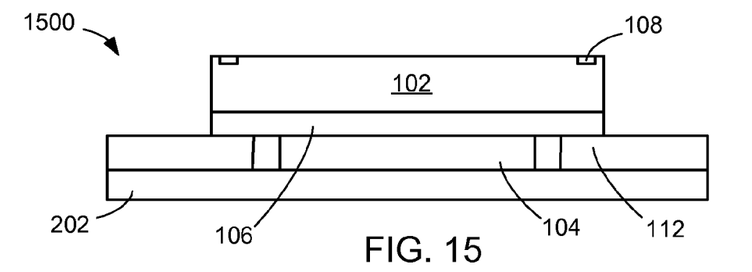
FIG. 15 is a cross-sectional view similar to FIG. 13 of an unfinished semiconductor package of the third embodiment of the present invention after a third intermediate stage of the process.

Referring now to FIG. 15, therein is shown a cross-sectional view similar to FIG. 13 of an unfinished semiconductor package 1500 of the third embodiment of the present invention after a third intermediate stage of the process. The semiconductor die 102 is attached to the die support pad 104 and the lead 112 through the die attach adhesive 106. The semiconductor die 102 may be pre-coated with the die attach adhesive 106. The die attach adhesive 106 is in contact with the lead 112. The bonding pad 108 is on the semiconductor die 102. The pre-coating of the die attach adhesive 106 reduces the difficulty of adhesive dispense problem encountered before.

Figure 16:
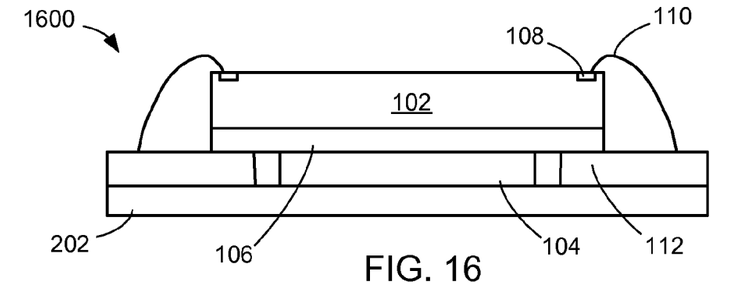
FIG. 16 is a cross-sectional view similar to FIG. 13 of an unfinished semiconductor package of the third embodiment of the present invention after a fourth intermediate stage of the process.

Referring now to FIG. 16, therein is shown a cross-sectional view similar to FIG. 13 of an unfinished semiconductor package 1600 of the third embodiment of the present invention after a fourth intermediate stage of the process. The bonding wire 110 connects the bonding pad 108 to the lead 112.

Figure 17:
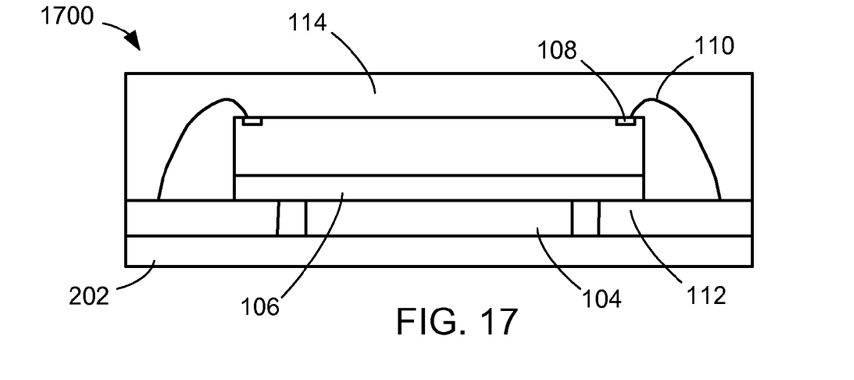
FIG. 17 is a cross-sectional view similar to FIG. 13 of an unfinished semiconductor package of the third embodiment of the present invention after a fifth intermediate stage of the process.

Referring now to FIG. 17, therein is shown a cross-sectional view similar to FIG. 13 of an unfinished semiconductor package 1700 of the third embodiment of the present invention after a fifth intermediate stage of the process. The semiconductor die 102, the bonding pad 108, the bonding wire 110, the die attach adhesive 106, the die support pad 104, and the lead 112 are encapsulated by the mold compound 114. The mold compound 114 is also in touch with the coverlay tape 202.

Figure 18:
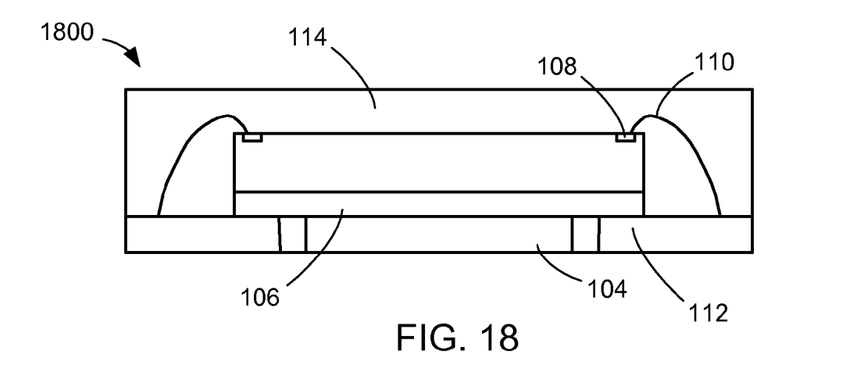
FIG. 18 is a cross-sectional view similar to FIG. 13 of an unfinished semiconductor package of the third embodiment of the present invention after a sixth intermediate stage of the process.

Referring now to FIG. 18, therein is shown a cross-sectional view similar to FIG. 13 of an unfinished semiconductor package 1800 of the third embodiment of the present invention after a sixth intermediate stage of the process. The coverlay tape 202 is removed. The removal method may be a peeling process.

Figure 19:
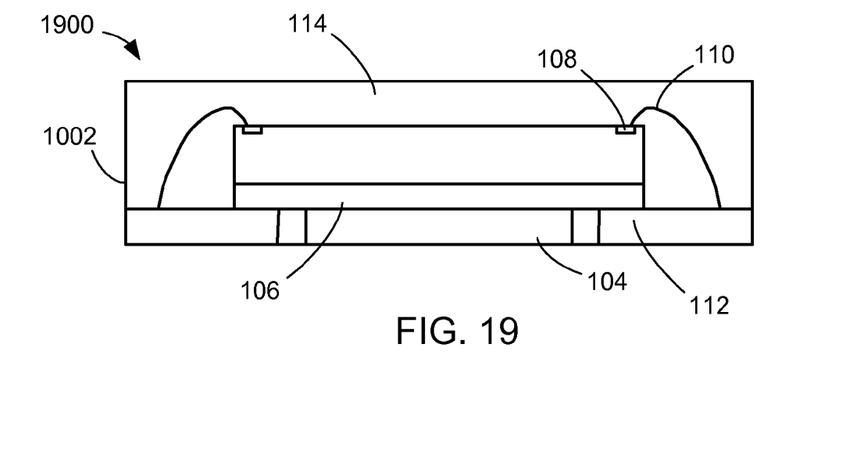
FIG. 19 is a cross-sectional view similar to FIG. 13 of an unfinished semiconductor package of the third embodiment of the present invention after a seventh intermediate stage of the process.

Referring now to FIG. 19, therein is shown a cross-sectional view similar to FIG. 13 of an unfinished semiconductor package 1900 of the third embodiment of the present invention after a seventh intermediate stage of the process. The leadframe is singulated and the package edge 1002 is formed.

Figure 20:
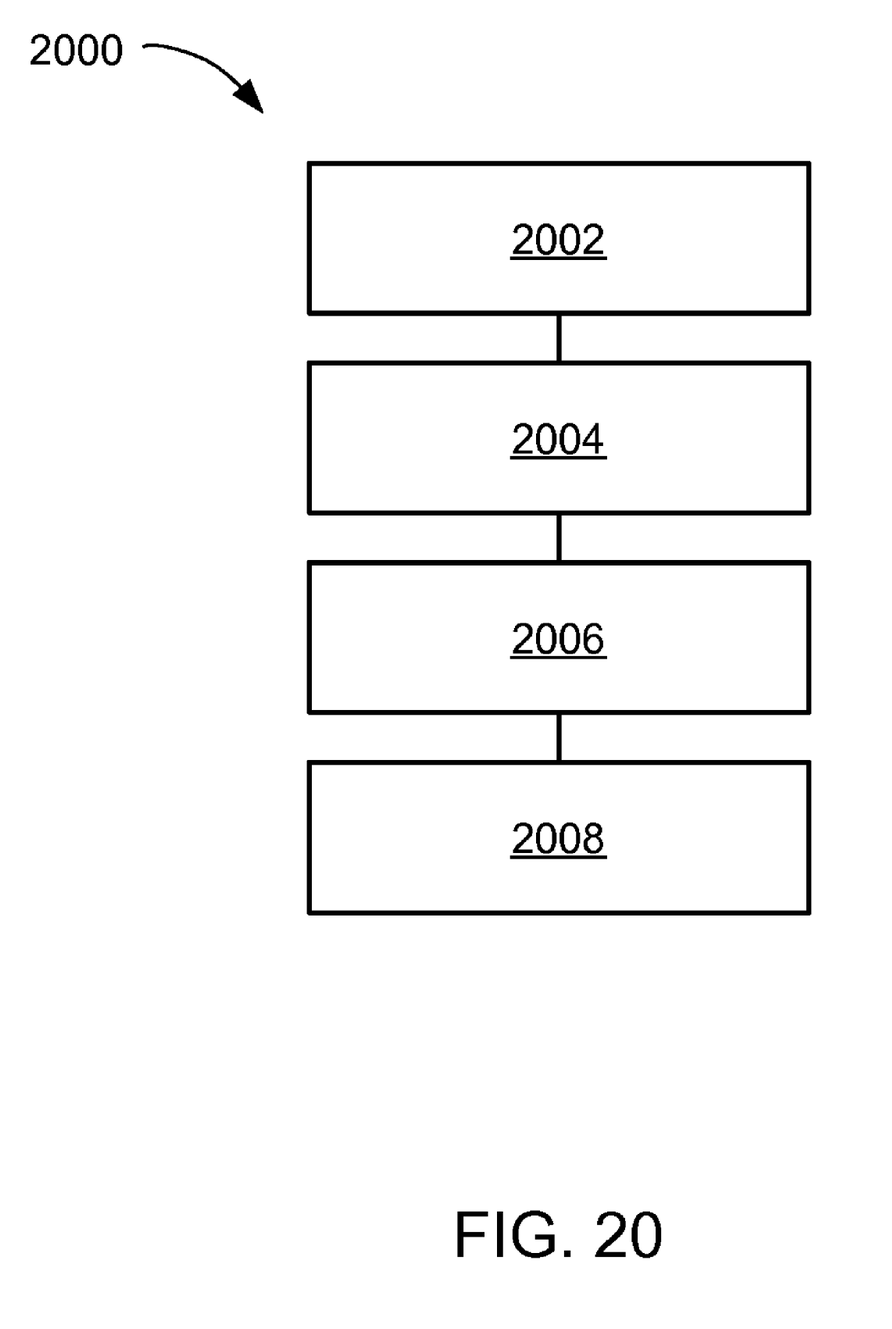
FIG. 20 is a flow chart of a semiconductor package system for manufacturing the semiconductor package system in an embodiment of the present invention.

Referring now to FIG. 20, therein is shown a flow chart of a semiconductor package system 2000 for manufacturing the semiconductor package system 100 in an embodiment of the present invention. The system 2000 includes providing a leadframe with a lead in a block 2002; making a die support pad separately from the leadframe in a block 2004; attaching a semiconductor die to the die support pad through a die attach adhesive, the semiconductor die being spaced from the lead in a block 2006; and connecting a bonding pad on the semiconductor die to the lead using a bonding wire in a block 2008.

Thus, it has been discovered that the integrated circuit package system of the present invention achieves the goals of reducing the difficulty in die attach adhesive dispense, maximizing the lead counts of the leadframe, alleviating the delamination problem, and solving the silver migration problem for the overhang die and the chip on lead approaches.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, reducing complexity, and reducing cost of integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit package system fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A semiconductor package system comprising:
   leads adjacent to a peripheral edge;
   a die support pad, formed without tiebars, made separately from the leads includes a bottom surface of the die support pad coplanar with the bottom surface of the leads;
   a semiconductor die attached to the die support pad through a die adhesive; and
   a bonding wire connecting a bonding pad on the semiconductor die to one of the leads.

2. The system as claimed in claim 1 wherein the semiconductor die overhangs the leads.

3. The system as claimed in claim 1 wherein the die support pad is pre-coated with the die attach adhesive.

4. The system as claimed in claim 1 wherein the semiconductor die is spaced from the leads.

5. The system as claimed in claim 1 wherein the die support pad has a die support pad groove formed at the bottom surface of the die support pad.

6. The system as claimed in claim 1 further comprising:
a mold compound encapsulating the semiconductor die, the bonding pad, the bonding wire, the die attach adhesive, and the die support pad.

7. The system as claimed in claim 6 wherein the semiconductor die, having the bonding pad thereon, is pre-coated with the die attach adhesive.

8. The system as claimed in claim 6 wherein a space between the semiconductor die and the leads is filled with the die attach adhesive.

9. The system as claimed in claim 6 wherein the die support pad is pre-plated with NiPd.

10. The system as claimed in claim 6 wherein the lead frame with a lead has corner leads adjacent to each other without an intervening portion of the leadframe.

* * * * *

UNITED STATES PATENT AND TRADEMARK OFFICE
CERTIFICATE OF CORRECTION

| | | |
|---|---|---|
| PATENT NO. | : 7,911,067 B2 | Page 1 of 1 |
| APPLICATION NO. | : 12/235144 | |
| DATED | : March 22, 2011 | |
| INVENTOR(S) | : Camacho et al. | |

It is certified that error appears in the above-identified patent and that said Letters Patent is hereby corrected as shown below:

Title Page, Item (57)

Abstract:
      Lines 1-2, delete "lead frame" and insert therefor --leadframe--
      Line 3, delete "lead frame" and insert therefor --leadframe--

Column 10:
      Claim 10, lines 6-7, delete "lead frame" and insert therefor --leadframe--

Signed and Sealed this
Thirty-first Day of May, 2011

David J. Kappos
*Director of the United States Patent and Trademark Office*